US011621677B2

(12) United States Patent
Na et al.

(10) Patent No.: US 11,621,677 B2
(45) Date of Patent: Apr. 4, 2023

(54) APPARATUS FOR PREVENTING COMPONENT BURNOUT IN ELECTRIC DEVICE AND METHOD THEREOF

(71) Applicant: Samsung Electronics Co., Ltd., Gyeonggi-do (KR)

(72) Inventors: Hyoseok Na, Gyeonggi-do (KR); Jooseung Kim, Gyeonggi-do (KR); Jihoon Kim, Gyeonggi-do (KR); Sanghun Sim, Gyeonggi-do (KR); Namjun Cho, Gyeonggi-do (KR); Hyunseok Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 194 days.

(21) Appl. No.: 17/127,064

(22) Filed: Dec. 18, 2020

(65) Prior Publication Data

US 2021/0194438 A1 Jun. 24, 2021

(30) Foreign Application Priority Data

Dec. 19, 2019 (KR) .......................... 10-2019-0170960

(51) Int. Cl.
| | | |
|---|---|---|
| *H03F 1/52* | (2006.01) | |
| *H04B 1/3827* | (2015.01) | |
| *H03D 7/00* | (2006.01) | |
| *H03L 7/099* | (2006.01) | |
| *H03F 3/24* | (2006.01) | |

(52) U.S. Cl.
CPC ................ *H03F 1/52* (2013.01); *H03D 7/00* (2013.01); *H03F 3/245* (2013.01); *H03L 7/099* (2013.01); *H04B 1/3827* (2013.01); *H03F 2200/294* (2013.01); *H03F 2200/451* (2013.01)

(58) Field of Classification Search
CPC .... H03D 3/24; H03D 7/00; H03F 1/02; H03F 1/26; H03F 1/32; H03F 1/52; H03F 3/04; H03F 3/245; H03G 1/00; H03G 3/00; H03L 7/00; H03L 7/08; H03L 7/10; H03L 7/089; H03L 7/093; H03L 7/099; H03L 7/107; H04B 1/04; H04B 1/26; H04B 1/38; H04B 1/40; H04B 1/3827
USPC ........... 327/156; 330/127, 149, 296; 361/78; 455/91, 126, 149, 319, 572
See application file for complete search history.

(56) References Cited

U.S. PATENT DOCUMENTS

| | | | |
|---|---|---|---|
| 2005/0017801 A1* | 1/2005 | Bachman, II | ......... H03F 1/3294 330/149 |
| 2005/0233714 A1 | 10/2005 | Kajiwara et al. | |
| 2008/0280574 A1 | 11/2008 | Rofougaran et al. | |
| 2008/0299935 A1 | 12/2008 | Safarian | |

(Continued)

OTHER PUBLICATIONS

International Search Report dated Apr. 20, 2021 issued in counterpart application No. PCT/KR2020/018709, 8 pages.

*Primary Examiner* — Shawkat M Ali
(74) *Attorney, Agent, or Firm* — The Farrell Law Firm, P.C.

(57) ABSTRACT

An apparatus and a method are provided for, in an electronic device which generates a reference signal having a reference frequency, mixes the reference signal to an input signal for transmission, and amplifies power, outputting a control signal for turning off amplifying the power, if a frequency of a signal acquired at an arbitrary point after generating the reference signal or mixing the signals before amplifying the power is out of a designated frequency band, thus preventing burnout of a power amplifier.

20 Claims, 11 Drawing Sheets

(56) References Cited

U.S. PATENT DOCUMENTS

| | | |
|---|---|---|
| 2010/0120475 A1 | 5/2010 | Taniuchi et al. |
| 2011/0234315 A1 | 9/2011 | Chen et al. |
| 2013/0113535 A1 | 5/2013 | Haralabidis |
| 2013/0113570 A1 | 5/2013 | Yin et al. |
| 2014/0266342 A1 | 9/2014 | Arai et al. |
| 2018/0367152 A1* | 12/2018 | Shibata ............ H03L 7/103 |
| 2022/0116193 A1* | 4/2022 | Gao ............ H04B 1/403 |

* cited by examiner

APPARATUS FOR PREVENTING COMPONENT BURNOUT IN ELECTRIC DEVICE AND METHOD THEREOF

CROSS-REFERENCE TO RELATED APPLICATION(S)

This application is based on and claims under 35 U.S.C. § 119(a) of a Korean patent application number 10-2019-0170960, filed on Dec. 19, 2019, in the Korean Intellectual Property Office, the disclosure of which is incorporated herein by reference in its entirety.

BACKGROUND

1. Field

The disclosure relates to a burnout prevention circuit for preventing burnout of an internal circuit in an electronic device and a method thereof.

2. Description of Related Art

A mobile electronic device may receive internal power from a battery. The power supplied by the battery may operate components such as various elements in the electronic device. The mobile electronic device may include, for example, an electronic device such as a smart phone a wearable device, or a tablet personal computer (PC), supporting wireless communication.

The electronic device supporting wireless communication may include at least one component for transmitting or receiving a radio frequency (RF) signal via one or more antennas. The component for transmitting the RF signal may include, for example, a component such as a phase locked loop (PLL) and/or a power amplifier (PA). The PLL may generate a reference signal for converting a baseband (BB) signal to other frequency band signal (e.g., an intermediate frequency (IF) signal or an RF signal).

A PLL in an electronic device needs to secure a frequency source regardless of an external condition such as temperature, and to vary precisely according to which frequency band to use. However, the PLL in the electronic device may unlock a PLL frequency because of an internal factor such as abnormal software or an external factor such as high temperature. For example, the abnormal software may indicate an abnormal software operation caused by a frequency change in an unexpected situation. For example, the PLL may output a high-power signal in a different frequency band due to noise.

If the PLL frequency is unlocked in the electronic device supporting wireless communication, a signal corresponding to an out-band frequency component of the frequency band to use may be applied to a transmission circuit. The applied signal may be reflected at a filter or a duplexer (DPx) disposed after a power amplifier in the transmission circuit. An output signal of the power amplifier has considerable output power, and the reflected signal may burn out the power amplifier.

SUMMARY

Aspects of the disclosure are to address at least the above-mentioned problems and/or disadvantages and to provide at least the advantages described below. Accordingly, an aspect of the disclosure is to provide a burnout prevention circuit for preventing unlocking of a reference signal frequency for frequency conversion in an electronic device which supports wireless communication, and a method thereof.

Additionally, an aspect of the disclosure is to provide a burnout prevention circuit for detecting that a radio frequency (RF) signal frequency is out of a designated frequency band and then controlling driving of a power amplifier in an electronic device which supports wireless communication, and a method thereof.

In accordance with an aspect of the disclosure, an electronic device is provided. The electronic device includes a local oscillator for generating a reference signal having a reference frequency, a frequency mixer for mixing the reference signal generated by the local oscillator to an input signal for transmission, a power amplifier for amplifying power of an output signal of the frequency mixer, a sensing circuit for detecting a signal at an arbitrary point between the local oscillator and the power amplifier, and a protection circuit for, if a frequency of the signal detected by the sensing circuit is out of a designated frequency band, outputting a control signal to at least one of the local oscillator and the power amplifier, wherein the protection circuit may include a buffer for converting the signal detected by the sensing circuit to a digital signal of a fixed voltage level, and a counter for counting a period of the digital signal converted by the buffer for a designated time.

In accordance with another aspect of the disclosure, a method for protecting an internal circuit in an electronic device is provided. The method includes generating a reference signal having a reference frequency, mixing the reference signal to an input signal for transmission, amplifying power of an output signal which is the mix of the reference signal and the input signal, detecting a signal at an arbitrary point after generating the reference signal or mixing the signals before amplifying the power, and converting the detected signal to a digital signal of a fixed voltage level, counting a period of the converted digital signal for a designated time, and if detecting, based on the counted value, that a frequency of the detected signal is out of a designated frequency band, outputting a control signal for controlling amplifying the power.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numerals are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as mere examples. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to their dictionary meanings, but are merely used to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
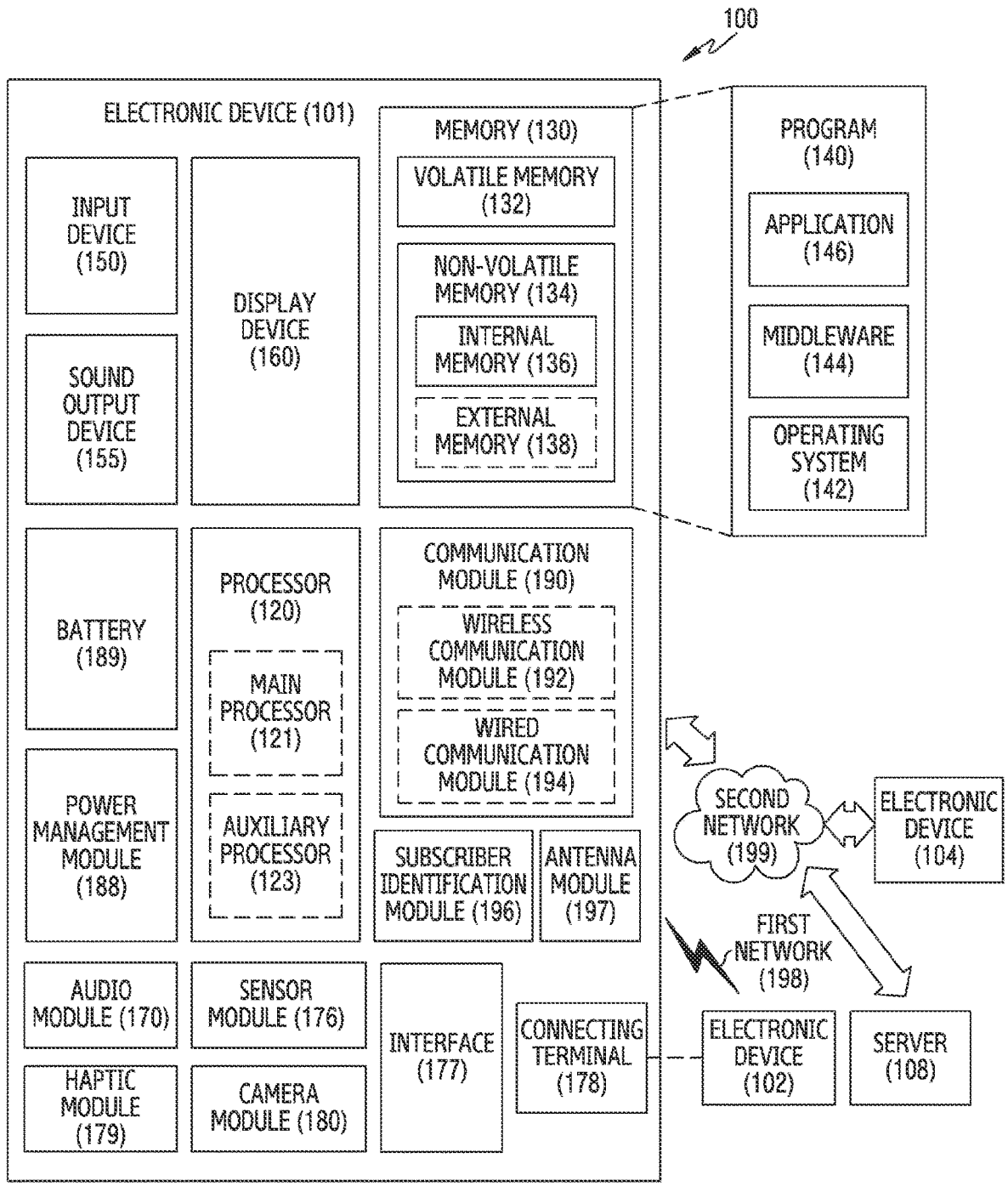
FIG. 1 is a block diagram illustrating an electronic device, according to an embodiment.

FIG. 1 illustrates an electronic device in a network environment, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as a single integrated circuit (IC). For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing a record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of the operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
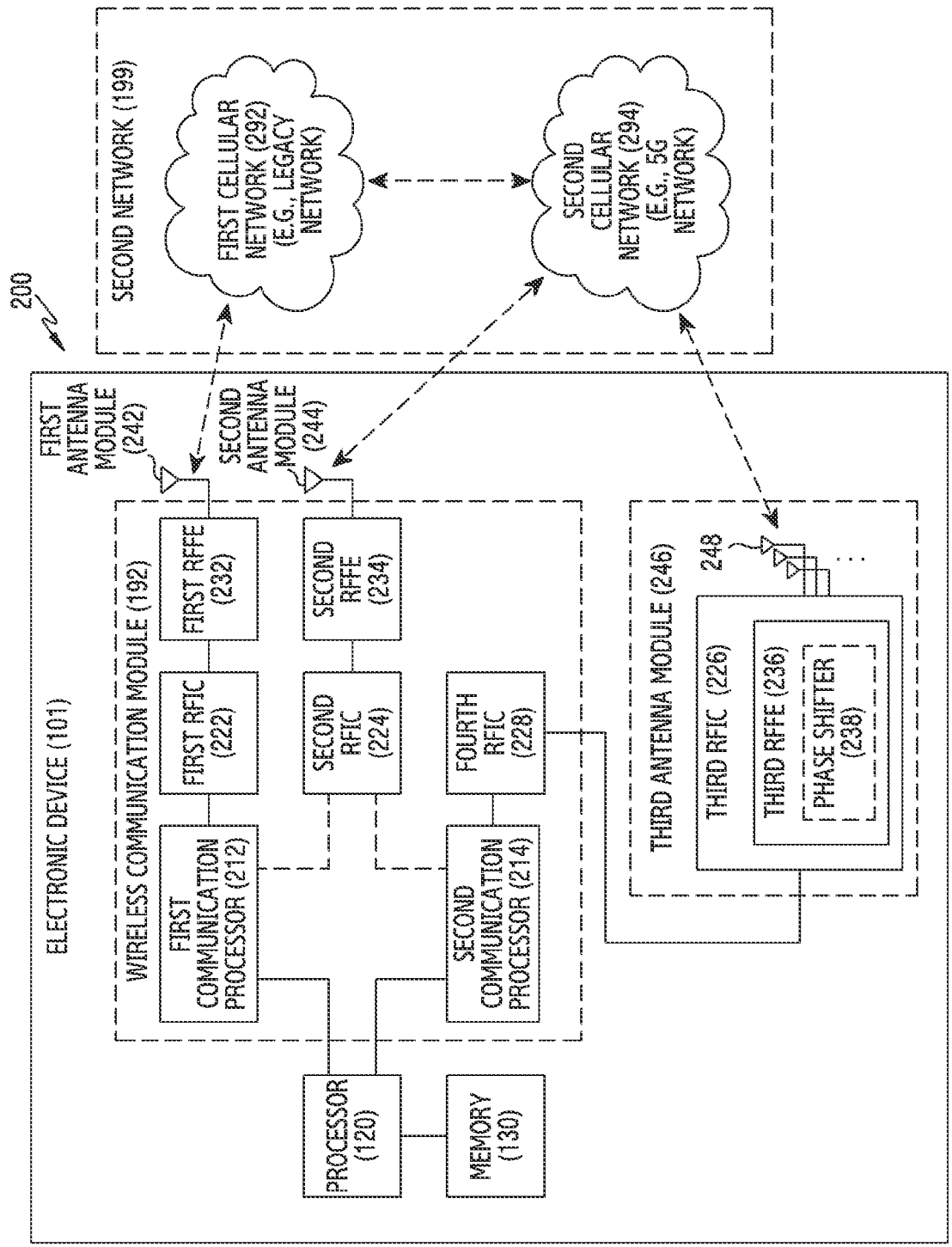
FIG. 2 is a block diagram illustrating configurations for supporting a plurality of frequency bands in an electronic device, according to an embodiment.

FIG. 2 illustrates an electronic device that supports multiple frequency bands, according to an embodiment.

Referring to FIG. 2, the electronic device 101 includes a first communication processor 212, a second communication processor 214, a first RFIC 222, a second RFIC 224, a third RFIC 226, a fourth RFIC 228, a first radio frequency front end (RFFE) 232, a second RFFE 234, a first antenna module 242, a second antenna module 244, and an antennas 248. The electronic device 101 further includes a processor 120 and a memory 130. A second network 199 includes a first cellular network 292 and a second cellular network 294. Alternatively, the electronic device 101 may further include at least one of the components illustrated in FIG. 1, and the second network 199 may further include at least another network. The first communication processor 212, the second communication processor 214, the first RFIC 222, the second RFIC 224, the fourth RFIC 228, the first RFFE 232, and the second RFFE 234 configure at least a part of the wireless communication module 192. Alternatively, the fourth RFIC 228 may be omitted or may be included as a part of the third RFIC 226.

The first communication processor 212 may support establishment of a communication channel of a band to be used for wireless communication with the first cellular communication network 292, and legacy network communication via the established communication channel. The first cellular network 292 may be a legacy network including a second generation (2G), third generation (3G), 4G, or long term evolution (LTE) network. The second communication processor 214 may support establishment of a communication channel corresponding to a designated band (e.g., about 6 GHz to about 60 GHz) among bands to be used for wireless communication with the second cellular network 294, and 5G network communication via the established communication channel. The second cellular network 294 may be a 5G network defined by the 3rd Generation Partnership Project (3GPP). In addition, the first communication processor 212 or the second communication processor 214 may support establishment of a communication channel corresponding to another designated band (e.g., about 6 GHz or lower) among the bands to be used for wireless communication with the second cellular network 294, and 5G network communication via the established communication channel. The first communication processor 212 and the second communication processor 214 may be implemented in a single chip or a single package. Alternatively, the first communication processor 212 or the second communication processor 214 may be configured, in a single chip or a single package, together with the processor 120, an auxiliary processor 123, or the communication module 190. The first communication processor 212 and the second communication processor 214 may be directly or indirectly connected to each other by an interface, in order to provide or receive data or a control signal in either or both directions.

The first RFIC 222 may convert, during transmission, a baseband signal generated by the first communication processor 212 into an RF signal of about 700 megahertz (MHz) to about 3 GHz used for the first cellular network 292 (e.g., a legacy network). During reception, the RF signal may be acquired from the first cellular network 292 via the first antenna module 242 and may be preprocessed via the first RFFE 232. The first RFIC 222 may convert the preprocessed RF signal into a baseband signal to be processed by the first communication processor 212.

The second RFIC 224 may convert, during transmission, a baseband signal generated by the first communication processor 212 or the second communication processor 214 into an RF signal (e.g., a 5G Sub6 RF signal) of a Sub6 band (e.g., about 6 GHz or lower) used for the second cellular network 294 (e.g., 5G network). During reception, the 5G Sub6 RF signal may be acquired from the second cellular network 294 via the second antenna module 244 and may be preprocessed via the second RFFE 234. The second RFIC 224 may convert the preprocessed 5G Sub6 RF signal into a baseband signal to be processed by the first communication processor 212 or the second communication processor 214.

The third RFIC 226 may convert a baseband signal generated by the second communication processor 214 into an RF signal (e.g., a 5G Above6 RF signal) of a 5G Above6 band (e.g., about 6 GHz to about 60 GHz) to be used for the second cellular network 294. During reception, the 5G Above6 RF signal may be acquired from the second cellular network 294 via the antenna 248 and may be preprocessed via the third RFFE 236. The third RFIC 226 may convert the preprocessed 5G Above6 RF signal into a baseband signal to be processed by the second communication processor 214. The third RFFE 236 may be configured as a part of the third RFIC 226.

The electronic device 201 may include the fourth RFIC 228 separately from or as at least a part of the third RFIC 226. In this case, the fourth RFIC 228 may convert a baseband signal generated by the second communication processor 214 into an RF signal (e.g., an intermediate frequency (IF) signal) of an IF band (e.g., about 9 GHz to about 11 GHz), and then may transfer the IF signal to the third RFIC 226. The third RFIC 226 may convert the IF signal into a 5G Above6 RF signal. During reception, the 5G Above6 RF signal may be received from the second cellular network 294 via the antenna 248 and may be converted to an IF signal by the third RFIC 226. The fourth RFIC 228 may convert the IF signal into a baseband signal to be processed by the second communication processor 214.

The first RFIC 222 and the second RFIC 224 may be implemented as a single chip or at least part of a single package. The first RFFE 232 and the second RFFE 234 may be implemented as a single chip or at least part of a single package. Alternatively, at least one of the first antenna module 242 or the second antenna module 244 may be omitted, or may be combined with another antenna module in order to process RF signals in a plurality of corresponding bands.

The third RFIC 226 and the antenna 248 may be disposed on the same substrate in order to configure a third antenna module 246. For example, the wireless communication module 192 or the processor 120 may be disposed on a first substrate (e.g., a main PCB). In this case, the third RFIC 226 may be disposed in a partial area (e.g., a bottom surface) of a second substrate (e.g., a sub-PCB) separate from the first substrate, and the antenna 248 may be disposed in another partial area (e.g., a top surface), thereby configuring the third antenna module 246. By placing the third RFIC 226 and the antenna 248 on the same substrate, it is possible to reduce the length of a transmission line therebetween. This configuration may reduce the loss (e.g., attenuation) of a signal, which is caused due to a transmission line, in a high frequency band (e.g., about 6 GHz to about 60 GHz) used for 5G network communication. Accordingly, the electronic device 101 may improve the quality or speed of communication with the second cellular network 294.

The antennas 248 may be configured by an antenna array including a plurality of antenna elements for beamforming. In this case, the third RFIC 226 may include a plurality of phase shifters 238 corresponding to the plurality of antenna elements, as a part of the third RFFE 236. During transmission, each of the plurality of phase shifters 238 may convert the phase of a 5G Above6 RF signal to be transmitted to the outside (e.g., to a base station of the 5G network) of the electronic device 101 via a corresponding antenna element. During reception, each of the plurality of phase shifters 238 may convert the phase of the 5G Above6 RF signal received from the outside via the corresponding antenna element, into the same or substantially the same phase. Accordingly, transmission or reception may be performed via beamforming between the electronic device 101 and the outside.

Each of or at least one of the first to third RFFEs 232, 234, and 236 may include a protection device and/or a method for preventing an internal PA from burning out due to frequency unlocking of a local oscillation signal generated by a local oscillator for supplying overcurrent or frequency mixing. The protection device may recognize that the frequency of the local oscillation signal is unlocked by sensing that the frequency of the local oscillation signal is out of a frequency band designated for transmission of a transmission signal.

Although FIG. 2 illustrates an example in which the electronic device 101 includes three RFFs 232, 234, and 236, the protection device and/or the method therefore may be applied regardless of the number of RFFEs included in the electronic device 101.

The second cellular network 294 may be operated independently of (e.g., stand-alone (SA) or in connection with (e.g., non-stand-alone (NSA)) the first cellular network 292. For example, the 5G network may have only an access network (e.g., 5G RAN or next generation RAN (NG RAN)) and may not have a core network (e.g., next generation core (NGC)). In this case, the electronic device 101 may access the access network of the 5G network, and then may access an external network (e.g., the Internet) under the control of a core network (e.g., evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by other components (e.g., the processor 120, the first communication processor 212, or the second communication processor 214).

The processor 120 of the electronic device 101 may execute one or more instructions stored in the memory 130. The processor 120 may include a circuit for data processing, for example, at least one of an IC, an arithmetic logic unit (ALU), a field programmable gate array (FPGA), and large-scale integration (LSI). The memory 130 may store data related to the electronic device 101. The memory 130 may include a volatile memory, such as a random access memory (RAM) including a static random access memory (SRAM), and a dynamic RAM (DRAM), or may include a non-volatile memory, such as a flash memory, an embedded multimedia card (eMMC), and a solid state drive (SSD), as well as a read only memory (ROM), a magneto-resistive RAM (MRAM), a spin-transfer torque MRAM (STT-MRAM), a phase-change RAM (PRAM), a resistive RAM (RRAM), and a ferroelectric RAM (FeRAM).

The memory 130 may store instructions related to an application and instructions related to an OS. The OS is system software executed by the processor 120. The processor 120 may manage hardware components included in the electronic device 101 by executing the operating system. The operating system may provide an application programming interface (API) to applications that are software other than the system software.

One or more applications, which are a set of multiple instructions, may be installed in the memory 130. Installation of an application in the memory 130 may indicate that the application is stored in a format executable by the processor 120 connected to the memory 130.

Figure 3:
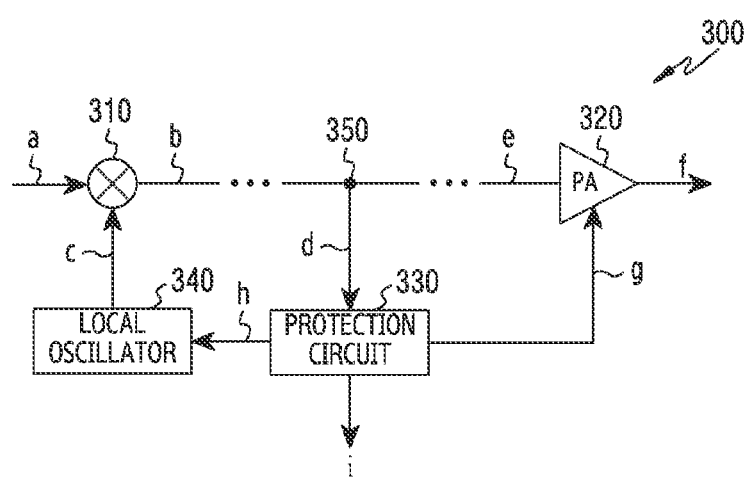
FIG. 3 is a diagram illustrating a configuration of a burnout prevention circuit in an electronic device, according to an embodiment.

FIG. 3 is a diagram illustrating an example of a structure of a circuit for preventing burnout of a power amplifier in an electronic device, according to an embodiment. FIG. 3 illustrates the single burnout prevention circuit 300 in the electronic device 101. However, as another example, the burnout prevention circuit 300 may be included for each transmission chain corresponding to a plurality of carrier frequencies. In this case, a frequency for signal processing inside the electronic device 101 differs, and the configuration and operations in FIG. 3 may be applied in the same manner.

Referring to FIG. 3, the burnout prevention circuit 300 may include at least one mixer 310, a power amplifier (PA) 320, a protection circuit 330 and/or a local oscillator 340.

The mixer 310 may mix an input signal a and a reference signal c and output a sum signal b (a+c) of the two signals (a, c). The mixer 310 may also output a difference signal (a−c) of the two signals (a, c). However, the difference signal, which is irrelevant to the transmission, shall not be considered in the following description. For example, the mixer 310 may be assumed to output only the sum signal b among the sum signal and the difference signal by mixing the two signals.

The input signal a may be a BB signal generated by a communication processor (e.g., the first communication processor 212 or the second communication processor 214 of FIG. 2). The mixer 310 may output, for example, the signal b corresponding to a sum (f1+f2) of a frequency f1 of the input signal a and a frequency f2 of the reference signal c. The signal b outputted by the mixer 310 may be, for example, an intermediate frequency (IF) signal or a radio frequency (RF) signal. Hereinafter, it is assumed that the signal b outputted by the mixer 310 is the RF signal, to ease the explanation. However, the protection circuit and the method thereof are not limited to the RF signal, but may be easily applied to the IF signal in the same manner or through some changes or modifications.

The PA 320 may amplify power of a signal e to an intended level, and output the amplified signal f. For example, the signal e inputted to the PA 320 may correspond to a resultant signal by processing the signal b outputted from the mixer 310 by one or more components disposed between the output of the mixer 310 and the input of the PA 320. For example, if there is no other component between the output of the mixer 310 and the input of the PA 320, the signal e inputted to the PA 320 may be substantially the same as the signal b outputted from the mixer 310.

The PA 320 may be driven by bias voltage Vcc or bias current Ic supplied from outside. The bias current Ic may be, for example, current flowing through whole or some resistor of the PA 320 by the supply of the bias voltage Vcc. Hereafter, the disclosure is explained based on the bias voltage Vcc, for the sake of convenience. The driving of the PA 320 may be controlled by whether the bias voltage Vcc is supplied. For example, the PA 320 may drive or stop in response to a control signal g from the protection circuit 330. For example, the PA 320 may adjust the amplification level of the inputted signal e, by controlling the bias current in response to the control signal g from the protection circuit 330. The bias current may be adjusted, for example, by controlling the bias voltage.

The protection circuit 330 may receive the signal d detected at an arbitrary position 350 between the output of the mixer 310 and the input of the PA 320, monitor a change of information such as the frequency of the detected signal d, and output one or more control signals for correcting a frequency of a reference signal for controlling the PA 320 and/or to be generated by the local oscillator 340 based on the monitored result. To monitor the information change such as the frequency of the detected signal d detected at the arbitrary position 350, the protection circuit 330 needs to recognize a carrier frequency band, for example, a band in a transmission chain for processing the detected signal. For example, if one or more components are disposed between the output of the mixer 310 and the arbitrary point 350, the signal d inputted to the protection circuit 330 may be different from the signal b outputted from the mixer 310. Otherwise, if no components are disposed between the output of the mixer 310 and the arbitrary point 350, the signal d inputted to the protection circuit 330 may be substantially the same as the signal b outputted from the mixer 310.

The protection circuit 330 may receive transmit band information from at least one processor (e.g., the processor 120, the first communication processor 212, or the second communication processor 214 of FIG. 2). The transmit band information may include transmit band information of the RF signal to transmit through the transmission chain. In this case, the protection circuit 330 may determine whether the frequency of the signal d is out of the band recognized by the transmit band information, and thus determine whether to correct the frequency of the reference signal for controlling the driving of the PA 320 and/or to be generated by the local oscillator 340.

According to another embodiment, the protection circuit 330 may gather information other than the transmit band information, and acquire the gathered information or transmit band information of the RF signal to be transmitted through the transmission chain by further considering the gathered information. The information other than the transmit band information may include at least one of, for example, temperature compensated crystal oscillator (TCXO) information provided by the local oscillator 340, and reference clock Ref Clock information provided from at least one processor connected through an MIPI. In this case, the protection circuit 330 may recognize the carrier frequency of the transmission chain for processing the signal d using the TCXO information and/or the Ref Clock information.

The protection circuit 330 may monitor the inputted signal d, and thus output at least one control signal for the PA 320. For example, if the frequency of the signal d of the inputted monitoring result is out of a designated frequency band, the protection circuit 330 may output at least one of the control signal g for the PA 320, a control signal h for the local oscillator 340 and/or a control signal i for the at least one processor (e.g., the processor 120 of FIG. 2, the first communication processor 212, or the second communication processor 214).

The control signal g outputted by the protection circuit 330 may control driving of the PA 320. The control signal g may protect the PA 320 from a situation which may cause burnout, such as overcurrent, for example, by controlling to block or control bias voltage applied to the PA 320. The control signal g may be used as a switching control signal, for example, by blocking the input signal e of the PA 320 or blocking the output signal f of the PA 320, thus protecting the PA 320 from the cause of burnout, such as overcurrent.

The control signal h outputted by the protection circuit 330 may control driving of the local oscillator 340. The control signal h may control to reset the local oscillator 340 or to correct the signal frequency to be generated by the local oscillator, to thus generate the reference signal c having the frequency of the designated frequency band.

The control signal i outputted by the protection circuit 330 may request the at least one processor to control for the protection of the PA 320. The control signal i may control the at least one processor to reset the local oscillator 340, to correct the signal frequency to be generated by the local oscillator 340 and/or to drive the PA 320.

The at least one coprocessor may control operations of one, some, or all of the components in the burnout prevention circuit 300. For example, the at least one processor may include the communication processors 212 and 214. For example, the at least one processor may protect the PA 320 from the overcurrent, by controlling a battery which supplies the driving power to the local oscillator 340, the PA 320 and/or the protection circuit 330 or a supply path of the driving power in response to the control signal i from the protection circuit 330. For example, the at least one processor may control to reset the local oscillator 340 in response to the control signal i from the protection circuit 330.

In the burnout prevention circuit 300 of FIG. 3, the protection circuit 330 outputs all of the control signals g, h and i. However, the burnout prevention circuit 300 may configure the protection circuit 330 to output only one or some of the control signals g, h and i.

In the electronic device 101 including the burnout prevention circuit 300 per transmission chain, the at least one processor may receive the control signal i from protection circuits 330 in a plurality of burning prevention circuits 300, and accordingly control to prevent burnout of the PA 320 in each transmission chain. For example, the at least one processor may block the bias voltage of the PA 320, control the bias voltage (or the bias current), or control to correct the reference frequency of the local oscillator 340 or to reset the local oscillator 340.

Figure 4:
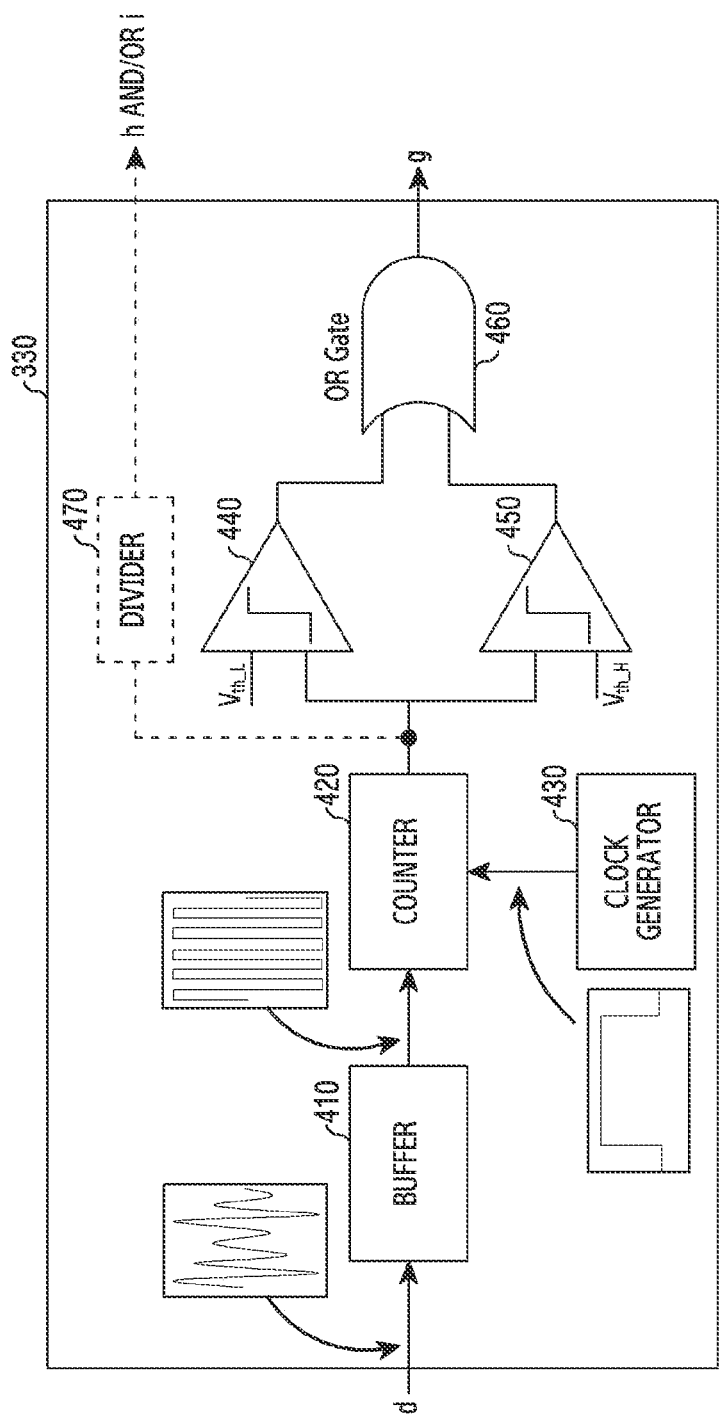
FIG. 4 is a diagram illustrating a configuration of a protection circuit in a burnout prevention circuit, according to an embodiment.

FIG. 4 is a diagram illustrating a configuration of a burnout prevention circuit, according to an embodiment.

Referring to FIG. 4, the protection circuit 330 may output at least one control signal based on whether a frequency characteristic of the inputted signal d is within a designated threshold range. The frequency characteristic may be, for example, a count value of a frequency period of the input signal d within a set period (time period). The designated threshold range may be defined by, for example, an upper bound value $V_{th\_H}$ and a lower bound value $V_{th\_L}$. The at least one control signal may be, for example, one, some, or all of the control signals g, h, and i of FIG. 3.

The protection circuit 330 may include a buffer 410, a counter 420, a clock generator 430, comparators 440 and 450 and/or an OR gate 460.

The buffer 410 may buffer and output the input signal d. The signal outputted by the buffer 410 may be a pulse signal having a specific magnitude (e.g., a specific power level). The buffer 410 may convert the input signal d to a digital signal, for example, to distinguish a carrier frequency of the input signal d. The converted digital signal may contain carrier frequency information, and its voltage level may be fixed.

The clock generator 430 may generate one clock (or pulse) having a time interval which is set or adjustable by external control. For example, the clock generator 430 may generate a signal which triggers a start point or an end point corresponding to the time interval which is set or externally controlled. Since the clock is implemented at, for example, a lower frequency than the carrier frequency, designing of the clock generator 430 may be relatively simplified. The clock generator 430 may be replaced by another component of the electronic device 101. For example, the clock generator 430 may use a PLL in an RFIC (e.g., the first RFIC 222, the second RFIC 224, or the third RFIC 226 of FIG. 2) or a clock generator for implementing a charge pump in an RFFE (e.g., the first RFFE 232, the second RFFE 234, or the third RFFE 236 of FIG. 2) of the electronic device 101.

The counter 420 may count a period of the signal outputted by the buffer 410 in a clock interval generated by the clock generator 430, and output the count value. Based on the count value, the frequency of the signal provided to the protection circuit 330 may be predicted. The count value acquired by the counter 420 may be applied as the input of the first and/or second comparators 440 and 450.

The first comparator 440 may compare two inputs, for example, the count value acquired by the counter 420 with the lower bound value $V_{th\_L}$ which is a first threshold. The second comparator 450 may compare two inputs, for example, the count value acquired by the counter 420 with the upper bound value $V_{th\_H}$ which is a second threshold. The lower bound value $V_{th\_L}$ which is the first threshold and the upper bound value $V_{th\_H}$ which is the second threshold may be determined by the frequency band for the transmission.

Table 1 defines the lower bound value $V_{th\_L}$ for the first comparator 440 and the upper bound value $V_{th\_H}$ for the second comparator 450 per designated frequency.

TABLE 1

|  | $V_{th\_L}$ | $V_{th\_H}$ |
|---|---|---|
| band 1 | 1920 | 1980 |
| band 2 | 1850 | 1910 |
| band 3 | 1710 | 1785 |
| ... | ... | ... |
| band 41 | 2496 | 2690 |

According to an embodiment, Table 1 may be generated as a look-up table. The look-up table may be stored in an internal memory or an external memory of the electronic device 101 directly accessible by the protection circuit 330 or indirectly accessible via other medium. The frequency bands and their corresponding lower bound value $V_{th\_L}$ and upper bound value $V_{th\_H}$ in the look-up table may be updated on a periodic or aperiodic basis. For example, the look-up table may be added with a new frequency band and its corresponding lower bound value $V_{th\_L}$ and upper bound value $V_{th\_H}$ on a periodic or aperiodic basis.

For example, the designated frequency band in the protection circuit 330 may be defined by a lower frequency limit $f_{th\_L}$ corresponding to the lower bound value $V_{th\_L}$ and an upper frequency limit $f_{th\_H}$ corresponding to the upper bound value $V_{th\_H}$. For example, a frequency $f_{in}$ of the signal d inputted to the protection circuit 330 may be assumed to satisfy a condition $f_{th\_H} \geq f_{in} \geq f_{th\_L}$ by exceeding the lower frequency limit $f_{th\_L}$ and falling below the upper frequency limit $f_{th\_H}$.

If the count value acquired by the counter 420 is less than the set lower bound value $V_{th\_L}$, the first comparator 440 may output the high value '1'. If the count value acquired by the counter 420 is greater than or equal to the set lower bound value $V_{th\_L}$, the first comparator 440 may output the low value '0'. If the count value acquired by the counter 420 is equal to the set lower bound value $V_{th\_L}$, the first comparator 440 may be configured to output the high value '1'. For example, the first comparator 440 may detect that the frequency of the input signal d falls below the lower frequency limit $f_{th\_L}$ of the designated frequency band.

If the count value acquired by the counter 420 is greater than the set upper bound value $V_{th\_H}$, the second comparator 450 may output the high value '1'. If the count value acquired by the counter 420 is less than or equal to the set upper bound value $V_{th\_H}$, the second comparator 450 may output the low value '0'. If the count value acquired by the counter 420 is equal to the set upper bound value $V_{th\_H}$, the second comparator 450 may output the high value '1'. For example, the second comparator 450 may detect that the frequency of the input signal d exceeds the lower frequency limit $f_{th\_H}$ of the designated frequency band.

The OR gate 460 may generate the control signal g for controlling the operation of the PA 320 based on the outputs of the first and second comparators 440 and 450. For example, if the high value is inputted from at least one of the first and second comparators 440 and 450, the OR gate 460 may output the control signal g to stop or limit the operation of the PA 320. For example, if the low value is inputted from both of the first and second comparators 440 and 450, the OR gate 460 may output the control signal g for maintaining or resuming the operation of the PA 320. The high value input from both of the first and second comparators 440 and 450 may be logically infeasible.

Table 2 shows an example of the outputs of the OR gate 460 in response to the inputs from the first and second comparators 440 and 450.

TABLE 2

| OUTPUTS OF THE FIRST COMPARATOR | OUTPUTS OF THE FIRST COMPARATOR | OUTPUTS OF THE OR GATE | PA OPERATION |
|---|---|---|---|
| 0 | 0 | 0 | NORMAL |
| 0 | 1 | 1 | TO STOP OR LIMIT |
| 1 | 0 | 1 | TO STOP OR LIMIT |
| 1 | 1 | ] | NONE |

Since neither of the first and second comparators 440 and 450 may output '1' in Table 2, the operation affecting the corresponding PA operation may not occur. This is because there is no input signal d of the frequency falling below the lower frequency limit $f_{th\_L}$ of the designated frequency band and exceeding the upper frequency limit $f_{th\_H}$ of the designated frequency band.

To prevent burnout of the PA 320 by the local oscillator 340 and/or the at least one processor (e.g., the processor 120, the first communication processor 212, or the second communication processor 214 of FIG. 2), the protection circuit 330 may include an additional component for generating the additional control signal h and/or i. The protection circuit 330 may further include, for example, a divider 470. The divider 470 is depicted in the dotted line in FIG. 4, considering that the divider 470 is not an essential component.

The divider 470 may, for example, divide the count value outputted by the counter 420, and thus generate the additional control signal h and/or i. The additional control signal h and/or i may be provided to the local oscillator 340 and/or the at least one processor, to reset the local oscillator 340 or to correct the frequency of the reference signal generated by the local oscillator 340.

According to another embodiment, the divider 470, which generates the control signal h and/or i to be provided to the local oscillator 340 and/or the at least one processor, may be implemented as the essential configuration of the protection circuit 330, and the first and second comparators 440 and 450 and the OR gate 460 for generating the control signal g to control the operation of the PA 320 may be implemented as an additional configuration of the protection circuit 330.

Figure 5:
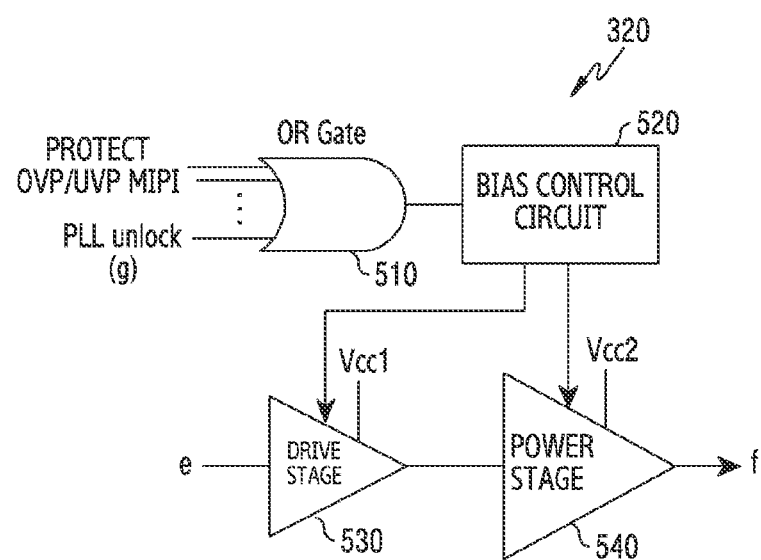
FIG. 5 is a diagram illustrating a configuration of a power amplifier in a burnout prevention circuit, according to an embodiment.

FIG. 5 is a diagram illustrating a configuration of a PA, according to an embodiment.

Referring to FIG. 5, the PA 320 may include an OR gate 510, a bias control circuit 520, a drive stage amplifier 530 and/or a power stage amplifier 540.

If at least one of one or more status detection signals is enabled, the bias control circuit 520 may block or adjust the bias voltage of the PA 320. The one or more status detection signals may include, for example, an over voltage protection (OVP) detection signal according to the voltage, an under voltage protection (UVP) detection signal according to low voltage, an abnormal MIPI signal and/or a PA burnout prevention control signal g. The PA burnout prevention control signal g in the one or more status detection signals may be one of control signals generated to detect frequency unlocking in the PLL corresponding to the local oscillator 340, and to address the unlocking.

If at least one of input signals, for example, the OVP/UVP detection signal, the abnormal MIPI signal and/or the PA burnout prevention control signal g is enabled, the OR gate 510 may output a signal requesting to block or adjust the bias voltage to the bias control circuit 520. If a control signal g outputted from a protection circuit 330 is enabled, the OR gate 510 may output a signal requesting to block the bias voltage or to adjust the bias current level to the bias control circuit 520. The signal requesting to block the bias voltage or to adjust the bias current level may use a pulse. For example, the OR gate 510 may use the pulse to request to block the bias voltage or to adjust the bias current level.

If the pulse is applied from the OR gate 510, the bias control circuit 520 may be configured to turn off, and thus not to supply at least one of the bias voltage of the drive stage amplifier 530 and the bias voltage of the power stage amplifier 540 in the PA 320.

If one or more status detection signals inputted to the OR gate 510 are disabled, the bias control circuit 520 may maintain the bias voltage supply of the drive stage amplifier 530 and/or the bias voltage supply of the power stage amplifier 540, wherein the PA 320 performs a normal operation.

Figure 6:
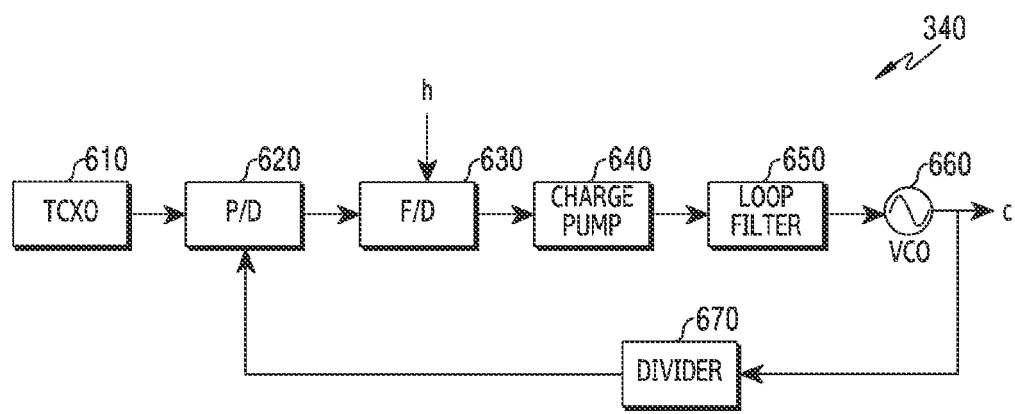
FIG. 6 is a diagram illustrating a configuration of a local oscillator in a burnout prevention circuit, according to an embodiment.

FIG. 6 is a diagram illustrating a configuration of a local oscillator, according to an embodiment.

Referring to FIG. 6, the local oscillator 340 for generating the reference signal c to be used to convert a BB signal to an RF signal may be implemented by a PLL. The PLL may include, for example, a voltage controlled oscillator (VCO) 660, a divider 670, a TCXO 610, a phase detector (P/D) 620, a frequency detector (F/D) 630, a charge pump 640, or a loop filter 650.

The VCO 660 may adjust an oscillator frequency based on voltage according to a carrier frequency of a band frequency used in the wireless communication. The divider 670 may output a signal of a frequency easily comparable, by dividing an output frequency of the VCO 660 by an appropriate rate. The frequency division by the divider 670 may ease the comparison with another frequency.

The TCXO 610 may generate a reference signal having a stable reference frequency without varying due to a temperature change. The P/D 620 may compare the reference frequency of the signal generated by the TCXO 610 with the frequency divided by the divider 670, and output a pulse train corresponding to a difference of the two frequencies.

The F/D 630 may adjust a period of the pulse train outputted from the P/D 620 based on a control signal h (a frequency correction control signal of the reference signal) provided from a protection circuit 330. The pulse train adjustment may correct the frequency of the reference signal finally outputted by the local oscillator 340.

The charge pump 640 may output current proportional to a pulse width corrected and outputted from the F/D 630. The charge pump 640 may accumulate and output electric charges in proportion to the pulse width corrected and outputted from the F/D 630. The loop filter 650 may filter out a noise frequency in the loop operation, and control the voltage at a control port of the VCO 660 according to an electric charge change accumulated by the charge pump 640 using a capacitor.

The PLL circuit in FIG. 6 may correct the PLL frequency (the output frequency of the local oscillator) by feeding back an output of a transceiver via a pre-amplifier and a Tx switch matrix, besides the VCO output.

Figure 7:
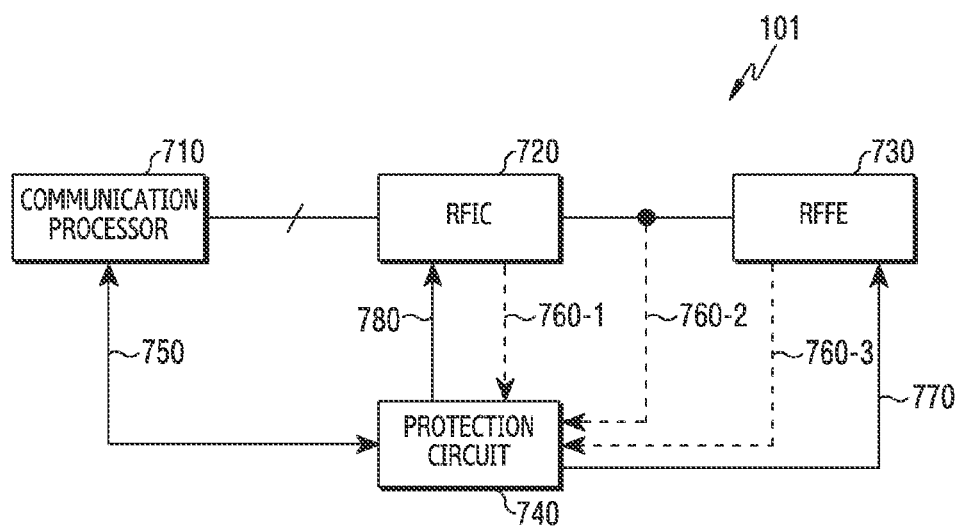
FIG. 7 is a diagram illustrating a burnout prevention circuit in an electronic device, according to an embodiment.

FIG. 7 is a diagram illustrating a burnout prevention circuit in an electronic device, according to an embodiment.

Referring to FIG. 7, the electronic device 101 may include at least one communication processor 710 (e.g., the processor 120, the first communication processor 212, or the second communication processor 214 of FIG. 2), an RFIC 720, an RFFE 730 and/or a protection circuit 740. The example of the protection circuit 740 may be the same as shown in FIG. 4. The RFIC 720 may include, for example, the mixer 310 and the local oscillator 340 of FIG. 3. The RFFE 730 may include, for example, the PA 320 of FIG. 3.

The protection circuit 740 may output a control signal for preventing burnout of a PA based on a frequency of an input signal. The input signal may include, for example, the input signal d of FIG. 3 and FIG. 4. The input signal may include a first input signal 760-1 acquired or measured in the RFIC 720, a second input signal 760-2 acquired or measured between the RFIC 720 and the RFFE 730, or a third input signal 760-3 acquired or measured in the RFFE 730. The first, second, and third input signals 760-1, 760-2, and 760-3 are depicted in the dotted line in FIG. 4, to indicate that the protection circuit 740 requires not all of the first, second, and third input signals 760-1, 760-2, and 760-3 but may require at least one of them. One of the first, second, and third input signals 760-1, 760-2, and 760-3 may be, for example, an input signal (e.g., the signal d) to be monitored to control the driving of the PA 320.

According to an embodiment, the protection circuit 740 may acquire the first input signal 760-1 at an arbitrary position between an output stage of the mixer 310 of the RFIC 720 and an output stage of the RFIC 720 or at the output stage of the local oscillator 340 of the RFIC 720. According to another embodiment, the protection circuit 740 may acquire the third input signal 760-3 at an arbitrary position between an input stage of the RFFE 730 and an input stage of the PA 320 of the RFFE 730.

The protection circuit 740 may monitor whether the input signal frequency is out of the designated frequency band, and output at least one of one or more control signals 750, 770, and 780 based on the monitoring result.

If the input signal frequency is out of the designated frequency band, the protection circuit 740 may output the first control signal 770 (e.g., the control signal g of FIG. 3) for controlling the driving of the PA 320 of the RFFE 730. For example, the first control signal 770 may stop or limit the driving of the PA 320, by blocking or adjusting the bias voltage (or the bias current) of the PA 320 of the RFFE 730. Limiting the driving of the PA 320 may lower an amplification rate of the input signal. For example, if the input signal frequency is in the designated frequency band, the protection circuit 740 may output the first control signal 770 for controlling the normal driving of the PA 320 of the RFFE 730.

If the input signal frequency is out of the designated frequency band, the protection circuit 740 may output the second control signal 780 (e.g., the control signal h of FIG. 3) for controlling the driving of the local oscillator 340 of the RFIC 720. For example, the second control signal 780 may reset the local oscillator 340 in the RFIC 720, or adjust the frequency of the reference signal generated by the local oscillator 340. For example, if the input signal frequency is in the designated frequency band, the protection circuit 740 may output the second control signal 780 directing to maintain a current operation state of the local oscillator 340 of the RFIC 720.

If the input signal frequency is out of the designated frequency band, the protection circuit 740 may output the third control signal 750 (e.g., the control signal i of FIG. 3) requesting the communication processor 710 to protect the PA 320 from overcurrent.

The communication processor 710 may control to protect the PA 320 from the overcurrent, in response to the third control signal 750 from the protection circuit 740. The communication processor 710 may control, for example, the local oscillator 340 of the RFIC 720, the PA 320 of the RFFE 730 and/or a battery which supplies driving power to the protection circuit 740 or a supply path of the driving power. The communication processor 710 may control, for example, to reset the local oscillator 340 of the RFIC 720, in response to the third control signal 750 from the protection circuit 740.

Figure 8A:
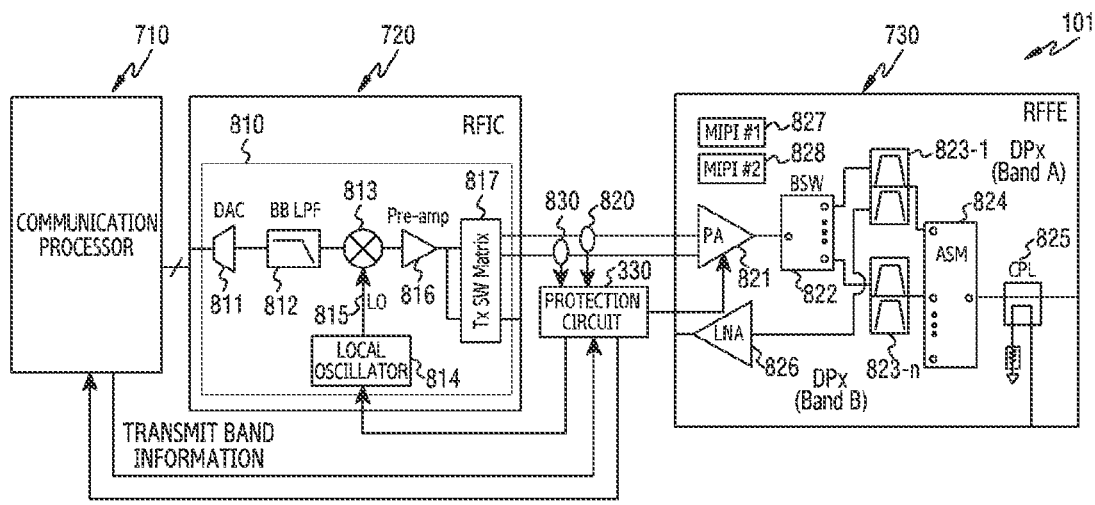
FIG. 8A is a diagram illustrating a deployment of a protection circuit in an electronic device, according to an embodiment.
Figure 8B:
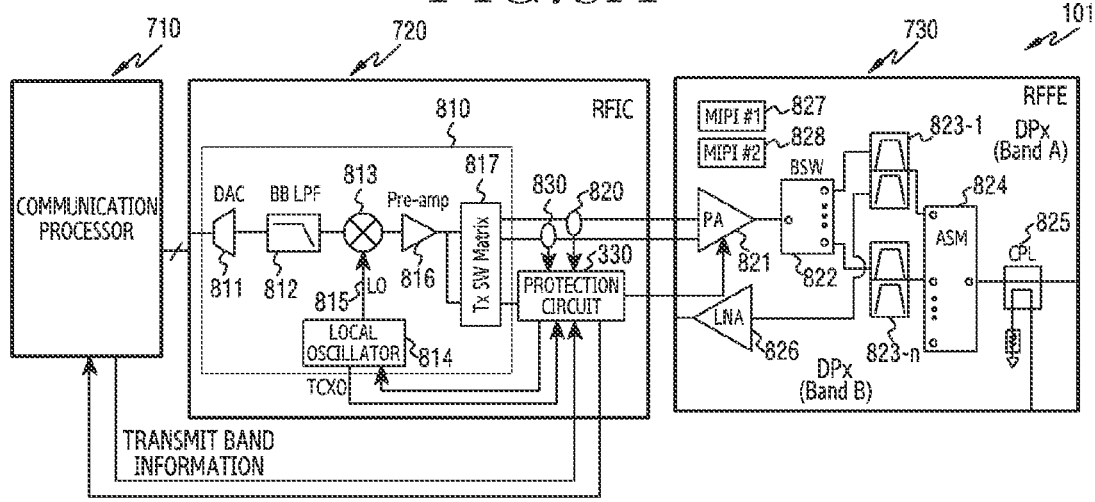
FIG. 8B is a diagram illustrating a deployment of the protection circuit in the electronic device, according to an embodiment.
Figure 8C:
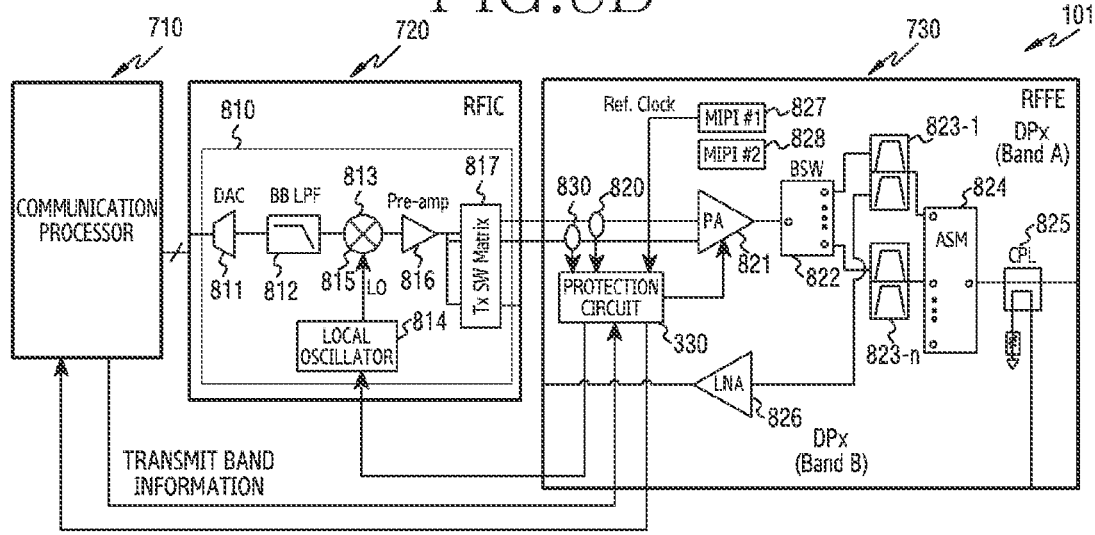
FIG. 8C is a diagram illustrating a deployment of the protection circuit in the electronic device, according to an embodiment.

FIGS. 8A, 8B, and 8C are diagrams illustrating a deployment of a protection circuit in an electronic device, according to an embodiment.

Referring to FIGS. 8A, 8B, and 8C, an RFIC 720 may include at least one Tx chain 810 which transmits a signal in a designated frequency band (e.g., a band). If the RFIC 720 includes a plurality of Tx chains, a frequency band for signal transmission may be allocated independently or uniquely for each Tx chain. For example, the frequency band allocated for each Tx chain may be different or identical. In FIG. 8, it is assumed that the RFIC 720 includes one Tx chain 810. However, if the RFIC 720 includes a plurality of Tx chains, it may be apparent that each Tx chain may have substantially the same structure and perform substantially the same operations as one Tx chain, to be explained below.

The Tx chain 810 may include a digital/analog convertor (DAC) 811, a base-band low pass filter (BBLPF) 812, a mixer 813, a local oscillator 814, a pre-amplifier 816 and/or a Tx switch (SW) matrix 817.

The DAC 811 may convert a digital BB signal provided by the communication processor 710 to an analog signal. The BBLPF 812 may filter the analog BB signal converted by the DAC 811 with a set frequency band.

The mixer 813 may mix the signal filtered by the BBLPF 812 and a reference signal 815 generated by the local oscillator 814, and output the mixed signal (e.g., the signal b of FIG. 3). The mixed signal may correspond to, for example, a sum signal of the signal filtered by the BBLPF 812 and the reference signal 815 generated by the local oscillator 814. The pre-amplifier 816 may pre-amplify the signal mixed by the mixer 813. The pre-amplified signal may be outputted as, for example, an output signal of one Tx chain through the Tx SW matrix 817. The signal outputted through the Tx SW matrix 817 may be one of the signals outputted from the RFIC 720.

The RFFE 730 may include a PA 821, a band select switch (BSW) 822, duplexers (DPxs) 823-1 through 823-n, an antenna switching module (ASM) 824, an LNA 826, a coupler (CPL) 825 or at least one MIPI, for example, a first MIPI 827 and a second MIPI 828.

The PA 821 may amplify and output a transmit signal provided from the RFIC 710, for example, an RF transmit signal (e.g. the signal e of FIG. 3). The BSW 822 may select a transmit signal per frequency of the band from the transmit signal outputted from the PA 821. The DPxs 823-1 through 823-n may filter the transmit signal and a receive signal. The ASM 824 may select the frequency signal of the band. The CPL 825 may couple the transmit signal and output the coupled signal to the RFIC 720 through a feedback receiving path (FBRx). The LNA 826 may low-noise amplify the receive signal received via an antenna, selected by the ASM 824, and filtered by the DPxs 823-1 through 823-n, and output the amplified signal to the RFIC 720. The first MIPI 827 and/or the second MIPI 828 of the RFFE 730 may be an interface for interconnecting at least one processor (e.g., the processor 120, the first communication processor 212, or the second communication processor 214) of the electronic device 101 with internal configurations of the RFFE 730 or internal configurations of the RFIC 720. The at least one processor may control operations of the internal configurations of the RFFE 730 and/or the internal configurations of the RFIC 720 through the first MIPI 827 and/or the second MIPI 828. To ease understanding, the first MIPI 827 and/or the second MIPI 828 are/is considered as processors. The first MIPI 827 and/or the second MIPI 828 which are the two processors may, for example, control or adjust the internal configurations of the RFFE 730 or the internal configurations of the RFIC 720.

If the band frequency for the wireless communication in the network environment is selected, the communication processor 710 may provide information of the selected band frequency to the RFIC 720 and the RFFE 730. The selected band frequency information may be, for example, transmit band information. The RFIC 720 or the RFFE 730 may establish a transmit path, based on the selected band frequency information provided from the communication processor 710. The RFIC 720 or the RFFE 730 may generate an RF signal by up-converting the transmit signal to the selected band frequency on the established transmit path, and amplify the generated RF signal.

If the band for the transmit path in the RFFE 730 is determined, the transmit path may be set to transmit the transmit signal over the designated band. The communication processor 710 may determine the band for the transmit path, and provide the RFIC 720 and/or the RFFE 730 transmit band information including the determined band information. The RFIC 720 and/or the RFFE 730 may establish the transmit path, to up-convert and amplify the transmit signal into the determined band using the transmit band information. For example, at least one of the first MIPI 827 or the second MIPI 828 of the RFFE 730 may be configured to operate some or all of sub-blocks of the RFFE 730 in the determined band.

FIG. 8A illustrates that the protection circuit (e.g., the protection circuit 330 of FIG. 3 or the protection circuit 740 of FIG. 7) is not included in the RFIC 720 and the RFFE 730, but is separately disposed in the electronic device 101. FIG. 8B illustrates that the protection circuit 330 is disposed in the RFIC 720 of the electronic device 101. FIG. 8C illustrates that the protection circuit 330 is disposed in the RFFE 730 of the electronic device 101.

Referring to FIG. 8A, one or more sensing circuits 820 and/or 830 according to an embodiment may be interposed between the output stage of the RFIC 720 and the input stage of the RFFE 730. The sensing circuit 820 may detect the signal outputted from the RFIC 720 and inputted to the RFFE 730, and provide the detected signal to the protection circuit 330. The protection circuit 330 may obtain a signal transmit band (e.g., a frequency band defined by an upper frequency limit and a lower frequency limit) from the transmit band information provided from the communication processor 710, and identify whether the detected signal frequency is out of the obtained transmit band. If the detected signal frequency is not in the obtained transmit band, the protection circuit 330 may output one or more control signals for preventing burnout of the PA 821.

In FIG. 8A, the sensing circuit 820 and the protection circuit 330 are not disposed in the RFIC 720 and the RFFE 730, but are separately disposed. However, the sensing circuit 820 may be disposed separately from the RFIC 720 and the RFFE 730, and the protection circuit 330 may be disposed in the RFIC 720 or the RFFE 730.

Referring to FIG. 8B, the sensing circuit 820 or the protection circuit 330 according to an embodiment may be disposed in the RFIC 720. The sensing circuit 820 may detect one or more signals outputted from the Tx chain of the RFIC 720, and provide the detected one or more signals to the protection circuit 330. The protection circuit 330 may obtain information (TCXO information) corresponding to the transmit band frequency provided from the local oscillator 814 besides the transmit band information provided from the communication processor 710. The protection circuit 330 may acquire the signal transmit band using the obtained information, and identify whether the detected signal frequency is out of the obtained transmit band. If the detected signal frequency is not in the obtained transmit band, the protection circuit 330 may output one or more control signals for preventing the burnout of the PA 821.

The sensing circuit 820 and the protection circuit 330 are disposed in the RFIC 720 in FIG. 8B. However, the sensing circuit 820 may be disposed in the RFIC 720, and the protection circuit 330 may be disposed separately or inside the RFFE 730.

Referring to FIG. 8C, the sensing circuit 820 or the protection circuit 330 according to an embodiment may be disposed in the RFFE 730. The sensing circuit 820 may detect a signal inputted to the RFFE 730, and provide the detected signal to the protection circuit 330. The protection circuit 330 may obtain Ref Clock information provided from the first MIPI 827 of the RFFE 730 besides the transmit band information provided from the communication processor 710. The protection circuit 330 may acquire the signal transmit band using the obtained information, and identify whether the detected signal frequency is out of the obtained transmit band. If the detected signal frequency is not in the obtained transmit band, the protection circuit 330 may output one or more control signals for preventing the burnout of the PA 821.

In FIG. 8C, the sensing circuit 820 and the protection circuit 330 are disposed in the RFFE 730. However, the sensing circuit 820 may be disposed in the RFFE 730, and the protection circuit 330 may be disposed separately or inside the RFIC 720.

In FIGS. 8A, 8B, and 8C, the protection circuit 330 provides the control signal (e.g., the control signal g, h or i of FIG. 3) to the PA 821, the local oscillator 814 of the RFIC 720, and the communication processor 710. According to another embodiment, the protection circuit 330 may provide the control signal (e.g., the control signal g, h or i of FIG. 3) to one or some of the PA 821, the local oscillator 814 of the RFIC 720, and/or the communication processor 710. For example, the protection circuit 330 may provide substantially the same control signal (e.g., the control signal h and i of FIG. 3) to the local oscillator 814 of the RFIC 720 and the communication processor 710. The substantially the same control signal may be, for example, a control signal for the same purpose. The same purpose of the control signal may adjust or reset the frequency of the local oscillator 814.

Figure 9A:
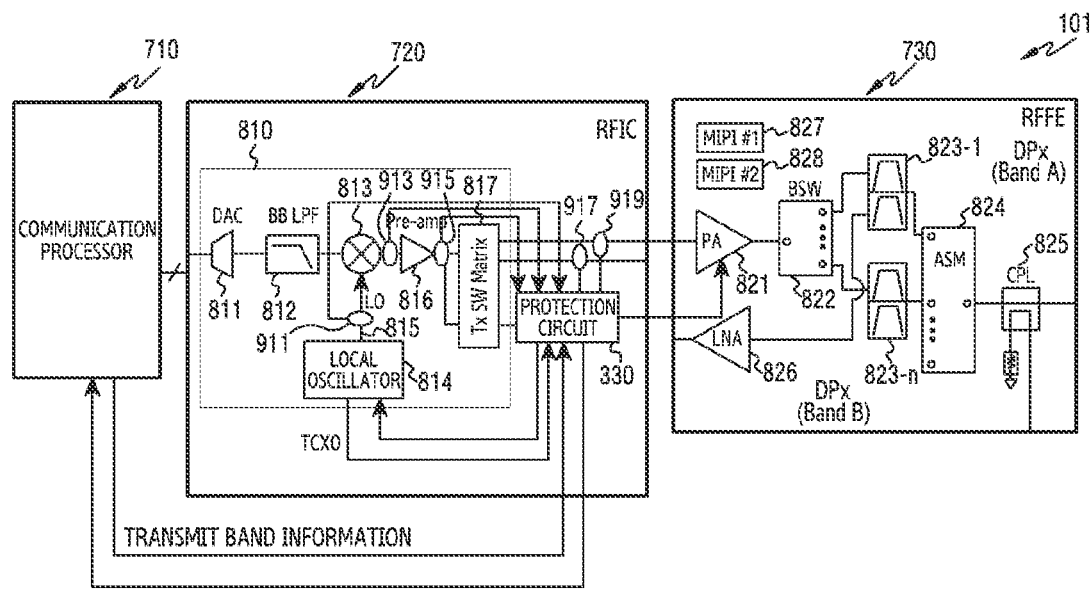
FIG. 9A is a diagram illustrating detection positions of a transmit signal for detecting unlocking of an output frequency in an electronic device, according to an embodiment.
Figure 9B:
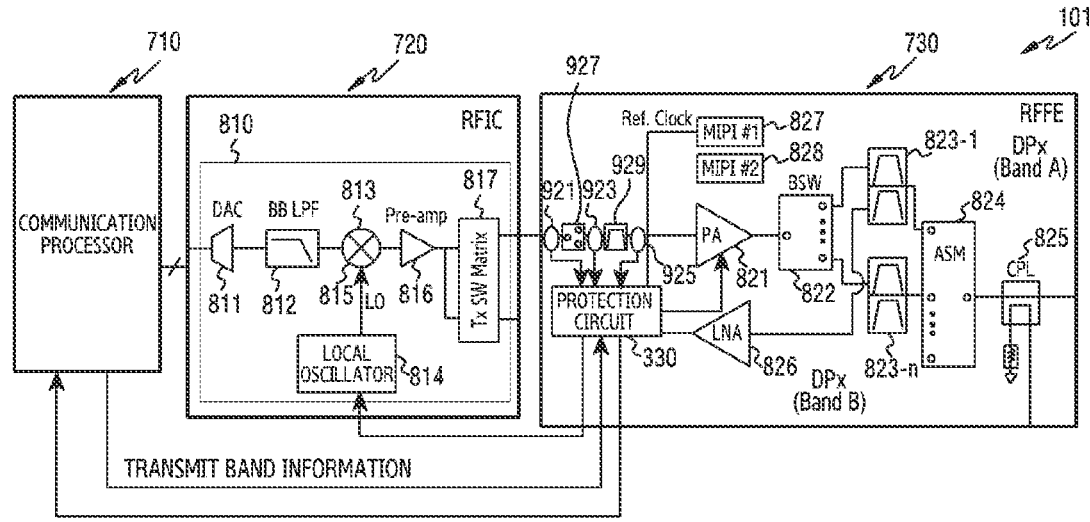
FIG. 9B is a diagram illustrating detection positions of the transmit signal for detecting unlocking of the output frequency in the electronic device, according to an embodiment.

FIGS. 9A and 9B are diagrams illustrating detection positions of a transmit signal in an electronic device, according to an embodiment. A sensing circuit 820 may be disposed at one or more of the transmit signal detection positions.

FIG. 9A illustrates the detection positions (e.g., sensing nodes) 911 through 919 at which the sensing circuits may be disposed, if a protection circuit 330 is disposed in an RFIC 720. The sensing circuit may detect a transmit signal for detecting unlocking of a reference frequency of a local oscillator 814 (e.g., the local oscillator 340) in the RFIC 720. The sensing circuits may include, for example, a first sensing circuit (e.g., the sensing circuit disposed at the detection position 911), a second sensing circuit (e.g., the sensing circuit disposed at the detection position 913), a third sensing circuit (e.g., the sensing circuit disposed at the detection position 915), a fourth sensing circuit (e.g., the sensing circuit disposed at the detection position 917), or a fifth sensing circuit (e.g., the sensing circuit disposed at the detection position 919).

The pre-amplifier 816 or the Tx SW matrix 817 may be disposed between the output of the mixer 813 and the final output stage of the RFIC 720. The first detection position 911 may be between the output stage of the local oscillator 814 and an input stage of a mixer 813 (e.g., the mixer 310), and the second detection position 913 may be between the output stage of the mixer 813 and the input stage of the pre-amplifier 816. The third detection position 915 may be between the output stage of the pre-amplifier 816 and the input stage of the Tx SW matrix 817, and the fourth and fifth detection positions 917 and 919 may be between the output stage of the Tx SW matrix 817 and the final output stage of the RFIC 720.

The sensing circuit such as a CPL 825 may be disposed at at least one of the transmit signal detection positions 911 through 919. The signal acquired by the sensing circuit may be provided to the protection circuit 330. If the frequency of the signal acquired at at least one detection position is not in the designated frequency band, the protection circuit 330 may output one or more control signals (e.g., the control signal g, h, or i of FIG. 3) to corresponding components. The one or more control signals may be outputted, for example, to address the unlocking of the reference frequency or to prevent burnout of the PA due to the reference frequency unlocking. Information of the designated frequency band to be used to detect the reference frequency unlocking may be acquired by considering the transmit band information provided from the communication processor 710 and the TCXO information provided from the local oscillator 814. Herein, considering the TCXO information to acquire the designated frequency band information assumes that the detection positions 911 through 919 are disposed in the RFIC 720.

FIG. 9B illustrates the example of the transmit signal detection positions (e.g., sensing nodes) 921, 923, and 925 for detecting the reference frequency unlocking of the local oscillator 814 (e.g., the local oscillator 340) in the RFFE 730, if the protection circuit 330 is disposed in the RFFE 730. For example, the sensing circuits at the detection positions 921, 923, and 925 may include a sixth sensing circuit (e.g., the sensing circuit disposed at the detection position 921), a seventh sensing circuit (e.g., the sensing circuit disposed at the detection position 923), and an eighth sensing circuit (e.g., the sensing circuit disposed at the detection position 925).

The transmit signal detection positions 921, 923, and 925 may be input stages of configurations disposed between the input of the RFFE 730 and the input of the PA 821 (e.g., the PA 320). A switch 927 and a filter 929 may be disposed between the input of the RFFE 730 and the input of the PA 821. For example, the sixth detection position 921 may be between the input of the RFFE 730 and the input of the switch 927, the seventh detection position 923 may be between the input of the switch 927 and the input of the filter 929, and the eighth detection position 925 may be between the input of the filter 929 and the input of the PA 821.

The sensing circuit such as a CPL 825 may be disposed at at least one of the transmit signal detection positions 921, 923, and 925. The signal acquired by the sensing circuit may be provided to the protection circuit 330. If the frequency of the signal acquired at at least one detection position is not in the signal transmission band (e.g., the designated frequency band), the protection circuit 330 may output one or more control signals (e.g., the control signal g, h, or i of FIG. 3) to corresponding components. The one or more control signals may be outputted, for example, to address the unlocking of the reference frequency or to prevent burnout of the PA due to the reference frequency unlocking. Information of the designated frequency band to be used to detect the reference frequency unlocking may be acquired by considering the transmit band information and the Ref Clock information. The transmit band information may be provided by the communication processor 710, and the Ref Clock information may be provided from at least one processor through one MIPI (e.g., the first MIPI 827) of the RFFE 730. Herein, considering the Ref Clock information to acquire the designated frequency band information assumes that the detection positions 921, 923, and 925 are disposed in the RFFE 730.

Figure 10:
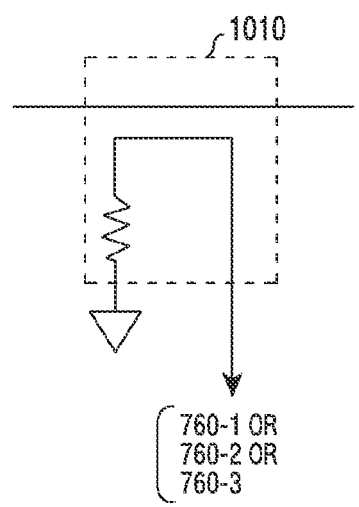
FIG. 10 is a diagram illustrating a configuration for sensing a transmit signal in an electronic device, according to an embodiment.

FIG. 10 is a diagram illustrating a configuration for sensing a transmit signal in an electronic device, according to an embodiment.

In FIG. 10, the sensing circuit is installed using a coupler 1010. The sensing circuit may acquire a transmit signal at an arbitrary position in the electronic device 101. The coupler 1010 may detect the signal flowing at the installed position, and provide the detected input signal 760-1, 760-2, or 760-3 (e.g., the signal d of FIG. 3) to the protection circuit 330. For example, the coupler 1010 may be installed at one of the transmit signal detection positions of FIG. 9A and FIG. 9B.

Figure 11:
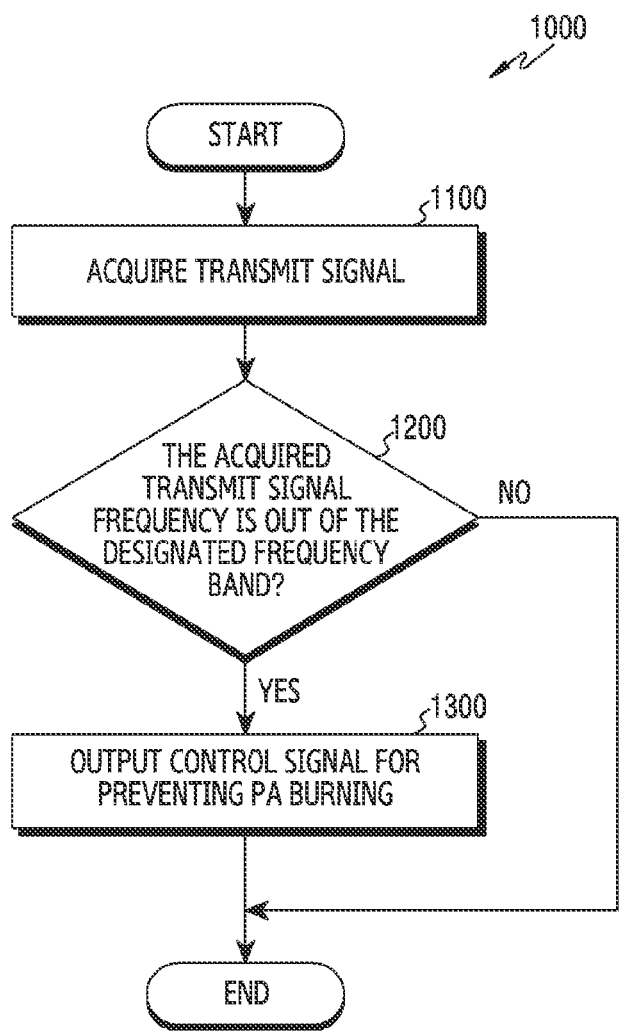
FIG. 11 is a flowchart for protecting a power amplifier in an electronic device, according to an embodiment.

FIG. 11 is a flowchart for protecting a PA in an electronic device, according to an embodiment.

The flowchart of FIG. 11 considers operations of a protection circuit 330 in the electronic device 101. The following description may further provide operations of other configurations corresponding to the operations of the protection circuit 330 according to the flowchart of FIG. 11.

Referring to FIG. 11, in step 1100, the protection circuit 330 may acquire a transmit signal at at least one of sensing circuits for detecting a transmit signal in the electronic device 101. The sensing circuits may be the sensing circuit 820 in FIGS. 8A, 8B, and 8C, the sensing circuit disposed at at least one of the detection positions 911 through 917 in FIG. 9A, or the sensing circuit disposed at at least one of the detection positions 921, 923, and 925 in FIG. 9B. The detection positions at which the sensing circuit is disposed may be designated according to, for example, the position of the protection circuit 330 in the electronic device 101. The positions of the protection circuit 330 are shown in, for example, FIGS. 8A, 8B, and 8C. The transmit signal detection positions according to the position of the protection circuit 330 are shown in, for example, FIGS. 9A and 9B. The sensing circuit does not need to be disposed at every detection position. For example, the sensing circuit may be disposed at only at least one of the detection positions. The sensing circuit may sense the transmit signal at the designated transmit signal detection position as shown in FIG. 10.

In step 1200, the protection circuit 330 may determine whether the acquired transmit signal frequency is out of the designated frequency band. For example, the acquired transmit signal frequency may belong to the reference signal frequency mixed to up-convert the BB signal to the IF signal or the RF signal. The reference signal may be generated by a local oscillator 340. The designated frequency band may correspond to the frequency band to be used for the transmit signal. The protection circuit 330 may recognize the designated frequency band using various methods. The designated frequency band may be acquired from, for example, the transmit band information (the transmit band information in FIGS. 8A, 8B, and 8C) provided by the communication processor 710, the TCXO information (the TCXO of FIG. 8B) provided by the local oscillator 340, or the reference frequency information (the Ref Clock of FIG. 8C) provided from the RFFE 730. For example, if the acquired transmit signal frequency is out of the designated frequency band, the protection circuit 330 may determine that the frequency of the reference signal generated by the local oscillator 340 is unlocked.

If it is determined that the frequency of the reference signal generated by the local oscillator 340 is unlocked, the protection circuit 330 may output one or more control signals (e.g., the control signals g, h, and i of FIG. 3) for preventing burnout of the PA 320, in step 1300.

According to an embodiment, one (e.g., the control signal g of FIG. 3) of the one or more control signals may be a first control signal for controlling the driving of the PA 320. The first control signal may protect the PA 320 from the situation which may cause burnout, such as overcurrent, due to the reference frequency unlocking, for example, by blocking or controlling the bias voltage applied to the PA 320.

According to another embodiment, another one (e.g., the control signal h of FIG. 3) of the one or more control signals may be a second control signal for controlling the driving of the PA 320. For example, the second control signal may request to reset the local oscillator 340 or to correct the frequency of the signal to be generated by the local oscillator 340, to thus generate the reference signal of the designated frequency band at the local oscillator 340.

According to another embodiment, yet another one (e.g., the control signal i of FIG. 3) of the one or more control signals may be a third control signal for requesting at least one processor (e.g., the processor 120, the first communication processor 212, or the second communication processor 214) to control the protection of the PA 320. For example, the third control signal may request the at least one processor to reset the local oscillator 340, to correct the frequency of the signal to be generated by the local oscillator 340, and/or to control the driving of the PA 320.

According to various embodiments of the disclosure, a protection circuit in an electronic device and a method thereof may prevent burnout of a PA because an output frequency of a local oscillator for frequency mixing is unlocked.

According to an embodiment, an electronic device may include a local oscillator for generating a reference signal having a reference frequency; a frequency mixer for mixing the reference signal generated by the local oscillator to an input signal for transmission; a power amplifier for amplifying power of an output signal of the frequency mixer; a sensing circuit for detecting a signal at an arbitrary point between the local oscillator and the power amplifier; and a protection circuit for, if a frequency of the signal detected by the sensing circuit is out of a designated frequency band, outputting a control signal to at least one of the local oscillator and the power amplifier, wherein the protection circuit comprises a buffer for converting the signal detected by the sensing circuit to a digital signal of a fixed voltage level, and a counter for counting a period of the digital signal converted by the buffer for a designated time.

The local oscillator and the frequency mixer are included in a radio frequency integrated circuit (RFIC), the power amplifier is included in a radio frequency front end (RFFE) module, and the protection circuit is included in one of the RFIC or the RFFE module.

The electronic device may further include at least one processor for determining the designated frequency band for transmitting the input signal, and providing the protection circuit with information indicating the designated frequency band, wherein the at least one control signal is a control signal for the protection circuit to request the at least one processor to reset the local oscillator.

The at least one control signal is a control signal for the protection circuit to direct the power amplifier to block bias voltage.

The at least one control signal is a control signal for the protection circuit to direct the local oscillator to reset.

The at least one control signal is a control signal for the protection circuit to direct the local oscillator to correct the reference frequency.

The protection circuit further comprises a first comparator for comparing a value counted by the counter with a lower bound value of the designated frequency band, and outputting a first bit value according to the comparison result; a second comparator for comparing the value counted by the counter with an upper bound value of the designated frequency band, and outputting a second bit value according to the comparison result; and an OR gate for outputting the at least one control signal by operating the first bit value and the second bit value.

The protection circuit further comprises a divider for dividing a value counted by the counter, and outputting at least one additional control signal based on the division result.

The at least one additional control signal comprises at least one of a control signal for directing the local oscillator to reset, a control signal for directing the local oscillator to correct the reference frequency or a control signal for requesting at least one processor to reset the local oscillator.

According to an embodiment of the disclosure, the electronic device may further include: an OR gate for receiving one of the at least one control signal as one input; and a bias control circuit for controlling bias voltage of the power amplifier in response to an output bit of the OR gate.

The local oscillator is formed with a phase locked loop (PLL), and the PLL is configured to correct an internal frequency in response to a control signal which directs to correct the reference frequency.

The sensing circuit comprises a coupler.

According to an embodiment, an operating method for protecting an internal circuit in an electronic device may include generating a reference signal having a reference frequency; mixing the reference signal to an input signal for transmission; amplifying power of an output signal which is the mix of the reference signal and the input signal; detecting a signal at an arbitrary point after generating the reference signal or mixing the signals before amplifying the power; converting the detected signal to a digital signal of a fixed voltage level; counting a period of the converted digital signal for a designated time; and if detecting, based on the counted value, that a frequency of the detected signal is out of a designated frequency band, outputting a control signal for controlling amplifying the power.

Outputting the control signal comprises determining a lower bound value and an upper bound value of the designated frequency band, and outputting a control signal for turning off amplifying the power, if the counted value is lower than the lower bound value or the counted value is higher than the upper bound value.

The control signal is a control signal for directing to block bias voltage of a power amplifier for amplifying the power.

Outputting the control signal comprises determining a lower bound value and an upper bound value of the designated frequency band, and outputting a control signal for directing to reset a local oscillator which generates the reference signal, if the counted value is lower than the lower bound value or the counted value is higher than the upper bound value.

Outputting the control signal comprises determining a lower bound value and an upper bound value of the designated frequency band, and outputting a control signal for directing to correct the reference frequency, if the counted value is lower than the lower bound value or the counted value is higher than the upper bound value.

Outputting the control signal comprises comparing the counted value with a lower bound value of the designated frequency band, and outputting a first bit value according to the comparison result; comparing the counted value with an upper bound value of the designated frequency band, and outputting a second bit value according to the comparison result; and outputting the control signal for turning off amplifying the power by operating the first bit value and the second bit value.

Outputting the control signal further comprises dividing the counted value, and outputting at least one additional control signal based on the division result.

The at least one additional control signal comprises at least one of a control signal for directing to reset a local oscillator which generates the reference frequency, a control signal for directing to correct the reference frequency, and a control signal for requesting at least one processor to reset the local oscillator.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a local oscillator for generating a reference signal having a reference frequency;
a frequency mixer for mixing the reference signal generated by the local oscillator to an input signal for transmission;
a power amplifier for amplifying power of an output signal of the frequency mixer;
a sensing circuit for detecting a signal at an arbitrary point between the local oscillator and the power amplifier, and
a protection circuit for, in case that a frequency of the signal detected by the sensing circuit is out of a designated frequency band, outputting at least one control signal to at least one of the local oscillator and the power amplifier, wherein the protection circuit comprises:
a buffer for converting the signal detected by the sensing circuit to a digital signal of a fixed voltage level, and
a counter for counting a period of the digital signal converted by the buffer for a designated time.

2. The electronic device of claim 1, wherein the local oscillator and the frequency mixer are included in a radio frequency integrated circuit (RFIC),
the power amplifier is included in a radio frequency front end (RFFE) module, and
the protection circuit is included in one of the RFIC or the RFFE module.

3. The electronic device of claim 1, further comprising:
at least one processor for determining the designated frequency band for transmitting the input signal, and providing the protection circuit with information indicating the designated frequency band,
wherein the at least one control signal is a control signal for the protection circuit to request the at least one processor to reset the local oscillator.

4. The electronic device of claim 1, wherein the at least one control signal is a control signal for the protection circuit to direct the power amplifier to block a bias voltage.

5. The electronic device of claim 1, wherein the at least one control signal is a control signal for the protection circuit to direct the local oscillator to reset.

6. The electronic device of claim 1, wherein the at least one control signal is a control signal for the protection circuit to direct the local oscillator to correct the reference frequency.

7. The electronic device of claim 1, wherein the protection circuit further comprises:
a first comparator for comparing a value counted by the counter with a lower bound value of the designated frequency band, and outputting a first bit value according to a first comparison result;
a second comparator for comparing the value counted by the counter with an upper bound value of the designated frequency band, and outputting a second bit value according to a second comparison result; and
an OR gate for outputting the at least one control signal by operating the first bit value and the second bit value.

8. The electronic device of claim 1, wherein the protection circuit further comprises:
a divider for dividing a value counted by the counter, and outputting at least one additional control signal based on a division result.

9. The electronic device of claim 8, wherein the at least one additional control signal comprises at least one of a first control signal for directing the local oscillator to reset, a second control signal for directing the local oscillator to correct the reference frequency, and a third control signal for requesting at least one processor to reset the local oscillator.

10. The electronic device of claim 1, further comprising:
an OR gate for receiving one of the at least one control signal as one input; and
a bias control circuit for controlling a bias voltage of the power amplifier in response to an output bit of the OR gate.

11. The electronic device of claim 6, wherein the local oscillator is formed with a phase locked loop (PLL), and
the PLL is configured to correct an internal frequency in response to a control signal which directs to correct the reference frequency.

12. The electronic device of claim 1, wherein the sensing circuit comprises a coupler.

13. A method for protecting an internal circuit in an electronic device, the method comprising:
generating a reference signal having a reference frequency;
mixing the reference signal to an input signal for transmission;
amplifying power of an output signal which is the mixed reference signal and input signal;
detecting a signal at an arbitrary point after generating the reference signal or mixing the reference signal and the input signal before amplifying the power;
converting the detected signal to a digital signal of a fixed voltage level;
counting a period of the converted digital signal for a designated time; and
in case that, based on the counted period, a frequency of the detected signal is out of a designated frequency band, outputting a control signal for controlling amplifying the power.

14. The method of claim 13, wherein outputting the control signal comprises determining a lower bound value and an upper bound value of the designated frequency band, and outputting the control signal for turning off amplifying the power, in case that the counted value is lower than the lower bound value or the counted value is higher than the upper bound value.

15. The method of claim 14, wherein the control signal is for directing to block a bias voltage of a power amplifier for amplifying the power.

16. The method of claim 13, wherein outputting the control signal comprises determining a lower bound value and an upper bound value of the designated frequency band, and outputting a control signal for directing to reset a local oscillator which generates the reference signal, in case that the counted value is lower than the lower bound value or the counted value is higher than the upper bound value.

17. The method of claim 13, wherein outputting the control signal comprises determining a lower bound value and an upper bound value of the designated frequency band, and outputting the control signal for directing to correct the reference frequency, in case that the counted value is lower than the lower bound value or the counted value is higher than the upper bound value.

18. The method of claim 13, wherein outputting the control signal comprises:
comparing the counted value with a lower bound value of the designated frequency band, and outputting a first bit value according to a first comparison result;
comparing the counted value with an upper bound value of the designated frequency band, and outputting a second bit value according to a second comparison result; and
outputting the control signal for turning off amplifying the power by operating the first bit value and the second bit value.

19. The method of claim 13, wherein outputting the control signal further comprises:
dividing the counted value, and outputting at least one additional control signal based on a division result.

20. The method of claim 19, wherein the at least one additional control signal comprises at least one of a first control signal for directing to reset a local oscillator which generates the reference frequency, a second control signal for directing to correct the reference frequency, and a third control signal for requesting at least one processor to reset the local oscillator.

* * * * *